United States Patent [19]
Tani

[11] Patent Number: 5,701,254
[45] Date of Patent: Dec. 23, 1997

[54] SWITCH LEVEL SIMULATION SYSTEM

[75] Inventor: Takahiro Tani, Hyogo, Japan

[73] Assignees: Mitsubishi Denki Kabushiki Kaisha, Tokyo; Mitsubishi Electric Semiconductor Software Co., Ltd., Hyogo, both of Japan

[21] Appl. No.: 490,363

[22] Filed: Jun. 14, 1995

[30]  Foreign Application Priority Data

Jan. 30, 1995 [JP] Japan ................... 7-012715

[51] Int. Cl.⁶ ............................................. G06F 19/00
[52] U.S. Cl. ................... 364/489; 364/490; 364/578; 395/500; 395/183.09
[58] Field of Search ..................... 395/500, 183.09; 364/488, 489, 490, 578; 437/34

[56]  References Cited

U.S. PATENT DOCUMENTS 5,550,760   8/1996   Razdan et al. ...................... 364/578

FOREIGN PATENT DOCUMENTS 5-266117   10/1993   Japan .................. G06F 15/60

OTHER PUBLICATIONS

Blaauw et al., "Derivation of Signal Flow for Switch Level Simulation", European Design Automation Conference, 1990, pp. 301–305.

Jouppi, "Derivation of Signal Flow Direction in MOS VLSI," IEEE Trans. on CAD, May 1987, vol. CAD-6, No. 3, pp. 480–490.

*Primary Examiner*—Kevin J. Teska
*Assistant Examiner*—Phallaka Kik
*Attorney, Agent, or Firm*—Lowe, Price, LeBlanc & Becker

[57]  ABSTRACT

In a switch level simulation system of the present invention, bidirectional switch models are allocated more accurately at locations which need to be bidirectional in circuit connection information and uni-directional switch models corresponding to the flow direction of a signal are allocated at the other locations. The connection information extracting section extracts the connection state of each device in a circuit indicated by circuit information and produces connection information. The input/output type determining section determines whether or not a switching device in a circuit is bidirectional and the flow direction of a signal in a uni-directional switching device, according to connection information. The circuit connection information generating section generates circuit connection information to be used by a simulation executing section, using the result of determining of the input/output type determining section.

16 Claims, 9 Drawing Sheets

SWITCH LEVEL SIMULATION SYSTEM

BACKGROUND OF THE INVENTION

1. Field of the Invention

The present invention relates to a switch level simulation system for verifying the operation of a logical circuit on switch level.

2. Description of the Prior Art

In order to verify the operation of a designed digital logical circuit, logical simulation or timing simulation sometimes needs to be executed on switch level. Namely, simulation using transistors as a basic device for the simulation is sometimes needed to be executed. In this case, it is necessary to produce circuit connection information of switch level. If a MOS device is contained in a digital logical circuit to be verified, the directivity of that MOS device must be considered so as to produce circuit connection information. That is, because the MOS device has bidirectional property in the transfer direction of a signal between its source terminal and drain terminal, it is necessary to produce circuit connection information by allocating a bidirectional switch model at a position which needs to have bidirectional property when the operation thereof is to be verified.

FIGS. 1, 2 are circuit diagrams for explaining a making method for equivalent circuits of MOS devices in a simulation system disclosed in Japanese Patent Laid-Open No.5-266117.

Referring to FIG. 1, reference numeral 100 designates a MOS device and numeral 200 designates a device connected to the source terminal S or the drain terminal D of the MOS device 100.

Referring to FIG. 2, numeral 201 designates an input device for inputting a signal from the source terminal S of the MOS device 100, numeral 202 designates an output device for outputting a signal to the source terminal S of the MOS device 100, numeral 203 designates an input device for inputting a signal from the drain terminal D of the MOS device 100 and numeral 204 designates an output device for outputting a signal to the drain terminal D of the MOS device 100.

Numeral 205a designates a line connecting device for receiving respective outputs of two output devices 202 located on the source terminal S side, numeral 205b designates a line connecting device for receiving output of another output device 202 on the source terminal S side and output of the line connecting device 205a and for supplying corresponding output to Si terminal, numeral 206 designates a line connecting device for receiving respective outputs of two output devices 204 located on the drain terminal D side and for supplying corresponding output to a Di terminal, numeral 207 designates a line connecting device for supplying a signal through the Si terminal and a signal through the Di terminal, numeral 208 designates a selector device for selecting a signal through the Si terminal or output from the line connecting device 207 depending on the signal level of a gate terminal, and numeral 209 designates a selector device for selecting a signal through the Di terminal or output from the line connecting device 207 depending on the signal level of the gate terminal. Here, the MOS device 100 can be equivalently substituted by the line connecting device 207, the selector device 208 and the selector device 209.

Next, the making method of the equivalent circuit of a MOS device will be described. Assume that a MOS device 100 to which the input devices 201, 203 and the output devices 202, 204 as shown in FIG. 1 are connected is provided. First, the devices 200 connected to the source terminal S of the MOS device 100 are classified to the input devices 201 or the output devices 202. Then, the devices 200 connected to the drain terminal D are classified to the input devices 203 or the output devices 204.

Then, line connecting devices for receiving respective output values of the output devices 202 connected to the source terminal S are placed. In this process, the line connecting devices 205a, 205b are allocated. Next, line connecting devices for receiving respective outputs of the output devices 204 connected to the drain terminal D are placed. In this process, the line connecting device 206 is allocated. Further, the line connecting device 207 for receiving the logical output of the line connecting device 205b on the source terminal S side and the logical output of the line connecting device 206 on the drain terminal D side are allocated. In FIG. 2, the input terminal of the source terminal S side is represented with Si and the input terminal of the drain terminal D side is represented with Di. The line connecting device mentioned here is a virtual device for obtaining a logical value in the case when a plurality of output signals collide with each other.

Next, a selector device 208 for selecting a logical value through the input terminal Si or output logical value of the line connecting device 207 depending on the signal level of the gate terminal G is allocated. Then, a selector device 209 for selecting a logical value through the input terminal Di or output logical value of the line connecting device 207 depending on the signal level of the gate terminal G is allocated. Then, the output from the selector device 208 is connected to respective input devices 201 and the output from the selector device 209 is connected to respective input devices 203. In FIG. 2, the output terminal of the selector device 208 is represented with $S_o$ and the output terminal of the selector device 209 is represented with $D_o$.

The MOS device 100 in the equivalent circuit produced as described above is capable of realizing both the case in which a logical value of the drain terminal D is transmitted to the source terminal S and the case in which a logical value of the source terminal S is transmitted to the drain terminal D. Namely, the MOS device 100 shown in FIG. 2 represents a bidirectional device. Thus, by making circuit connection information corresponding to this equivalent circuit and then executing logical simulation or timing simulation according to the circuit connection information, it is possible to verify the operation of a circuit strictly.

For logical simulation and timing simulation, event driven method is often used in order to execute effective simulation. However, generally, simulation for a bidirectional switch model has such a problem that the processing required for event driven type logical simulation or switch level simulation is more complicated than simulation for a unidirectional switch model. Thus, it takes very long until the simulation is completed.

For this reason, all MOS devices 100 are not substituted by bidirectional equivalent circuits, but the MOS devices 100, which are evidently uni-directional, are treated as a uni-directional device when producing circuit connection information. That is, a circuit designer determines the directions of switching devices considering the logical flow of a signal in a circuit. He does not treat a switching device, which is evidently uni-directional, as a bidirectional device. The above-mentioned direction determining process shortens the time required until the simulation is completed as compared with the case in which all the MOS devices 100 are substituted by bidirectional equivalent circuits.

However, such direction determining process reduces processing effectiveness of circuit designer. If he mistakes in determining the direction of a device, sufficient verification of a circuit operation is impossible. In a circuit as shown in FIG. 3, the drain terminal of a transistor 13 is connected to the drain terminal of a NMOS transistor 12 acting as a switching device. Therefore, a signal may flow from the drain terminal side of the NMOS transistor 12 to the source terminal side as shown by arrow.

Referring to FIG. 3, reference numeral 11 designates a symbol (hereinafter simply referred to as PMOS) for indicating a PMOS transistor, numeral 12 designates a symbol (hereinafter simply referred to as NMOS transistor) for indicating a NMOS transistor the source terminal of which is connected to the drain terminal of the PMOS transistor 11, numeral 13 designates a NMOS transistor of which the drain terminal 11 is connected to the drain terminal of the NMOS transistor 12, numeral 17 designates a PMOS transistor, numeral 18 designates a NMOS transistor of which the drain terminal is connected to the drain terminal of the transistor 17, numeral 19 designates a PMOS transistor, and numeral 20 designates a NMOS transistor of which the drain terminal is connected to the drain terminal of the transistor 19. The PMOS transistor 17 and the NMOS transistor 18 form a MOS invertor A, and the PMOS transistor 19 and the NMOS transistor 20 form a MOS invertor B.

Numeral 21 designates a signal line between the drain terminal of the PMOS transistor 11 and the source terminal of the NMOS transistor 12, and the input terminal of the MOS invertor, numeral 22 designates a signal line between the drain terminal of the NMOS transistor 12 and the drain terminal of the NMOS transistor 13, and the input terminal of the MOS invertor B, numeral 23 designates an output line of the MOS invertor A and numeral 24 designates an output line of the MOS invertor B. Numeral 25 designates a symbol for power supply and numeral 26 designates a symbol for grounding.

As for the NMOS transistor 12, if a circuit designer makes circuit connection information assuming that it is uni-directional, it is impossible to verify the operation in the case when a signal flows in the direction of arrow shown in the Figure. Namely, such an error of allocation that a uni-directional NMOS transistor 12 is placed in the circuit makes it difficult or impossible to verify the operation of the circuit completely.

As described above, if the conventional switch level simulation system is used, when the simulation is executed assuming that respective switching devices are bidirectional devices, it takes tremendously long time. This is the first problem. Further, the second problem is that if uni-directional switching devices of respective switching devices in a circuit are defined and information 5 about uni-directional connection is produced about such defined switching devices in order to execute simulation, there is a possibility that the operation thereof cannot be verified sufficiently due to a mistake of the definition.

SUMMARY OF THE INVENTION

An object of the present invention is to solve the aforementioned problem and provide a switch level simulation system in which bidirectional switch models are allocated more accurately at locations which need to have bidirectional property in circuit connection information and in which uni-directional switch models are allocated according to the flow direction of a signal at the other locations.

A switch level simulation system comprises a connection information extracting section for extracting the connection state of each device in a circuit indicated by circuit information, an input/output type determining section for determining whether a switching device in the circuit is bidirectional and determining the flow direction of a signal in an uni-directional switching device, according to connection information, and a circuit connection information generating section for generating circuit connection information to be used by a simulation executing section, using the result of determining of the input/output type determining section.

The input/output type determining section determines whether a switching device is uni-directional or bidirectional according to the direction of a device connected to the switching device. Further, it determines the flow direction of a signal in the uni-directional switching device. The circuit connection information generating section generates circuit connection information according to the result of determining of the input/output type determining section thereby enabling to verify the operation of the circuit more effectively.

Because the input/output type determining section determines whether or not a switching device is bidirectional and determines the flow direction of a signal in a uni-directional switching device according to connection information and then the circuit connection information generating section generates circuit connection information to be used by the simulation executing section, using the result of the input/output type determining section, even if a circuit designer mistakes the direction of a switching device or cannot define it, it is possible to correct the mistake or define the direction. That is, it is possible to obtain a simulation system capable of extracting circuit connection information from circuit information in which a switch model having a more accurately corrected directivity is allocated and then verifying the operation of the circuit more quickly.

In a switch level simulation system according to another aspect of the present invention, the input means includes a logical circuit diagram data producing section for entering logical circuit diagram data as circuit information. The input means enters logical circuit diagram data as circuit information and the circuit connection information generating section corrects logical circuit diagram data corresponding to the direction of a switching device determined by the input/output type determining section and generates circuit connection information from corrected logical circuit diagram data.

Because the input/output type determining section determines whether or not a switching device is bidirectional and the flow direction of a signal in a uni-directional switching device according to connection information extracted from logical circuit diagram data, even if a circuit designer mistakes the direction of a switching device, it is possible to eliminate that mistake and extract circuit connection information from circuit information in which a switch model having a more accurately corrected direction is allocated, thereby obtaining a simulation system capable of verifying the operation of a circuit effectively and more quickly.

A switch level simulation system according to still another aspect of the present invention comprises a message output section for outputting an alarm message when the direction of a switching device determined by the input/output type determining section is different from the direction thereof in logical circuit diagram data. The message output section outputs information indicating that the direction of a switching device in logical circuit diagram data is invalid in order to urge a circuit designer to correct the logical circuit diagram data.

Because such an alarm message is output when the direction of a switching device determined by the input/output type determining section is different from the direction thereof in logical circuit diagram data, if the circuit designer mistakes the direction of a switching device, it is possible for the circuit designer to recognize that mistake immediately.

A switch level simulation system according to a further aspect of the present invention comprises a circuit connection information generating section for correcting circuit information according to the result of determining of the input/output type determining section when the direction of a switching device determined by the input/output type determining section is different from the direction thereof in logical circuit diagram data and then generating circuit connection information. The circuit connection information generating section automatically corrects circuit information according to the result of determining of the input/output type determining section and automatically generates circuit connection information in which the direction of the switching device is more accurate.

Because the circuit connection information generating section corrects circuit information according to the result of determining of the input/output type determining section when the direction of a switching device determined by the input/output type determining section is different from the direction thereof in logical circuit diagram data and then generates circuit connection information, the direction of each switching device set by the circuit designer is automatically corrected so as to be valid, thereby automatically generating more accurate circuit connection information.

In a switch level simulation system according to a still further aspect of the present invention, the input means includes a layout data producing section for entering layout data as circuit information. The input means enters layout data as circuit information and the circuit connection information generating section automatically corrects circuit information based on the layout data corresponding to the direction of a switching device determined by the input/output type determining section and then generates circuit connection information from such corrected circuit information.

Because the input/output type determining section determines whether or not a switching device is bidirectional and the flow direction of a signal in a uni-directional switching device according to connection information extracted from the layout data, it is possible to automatically generate accurate circuit connection information from circuit information comprising data of switching devices which are not discriminated with respect to whether they are bidirectional or uni-directional.

DESCRIPTION OF THE PREFERRED EMBODIMENTS

Embodiment 1

Figure 4:
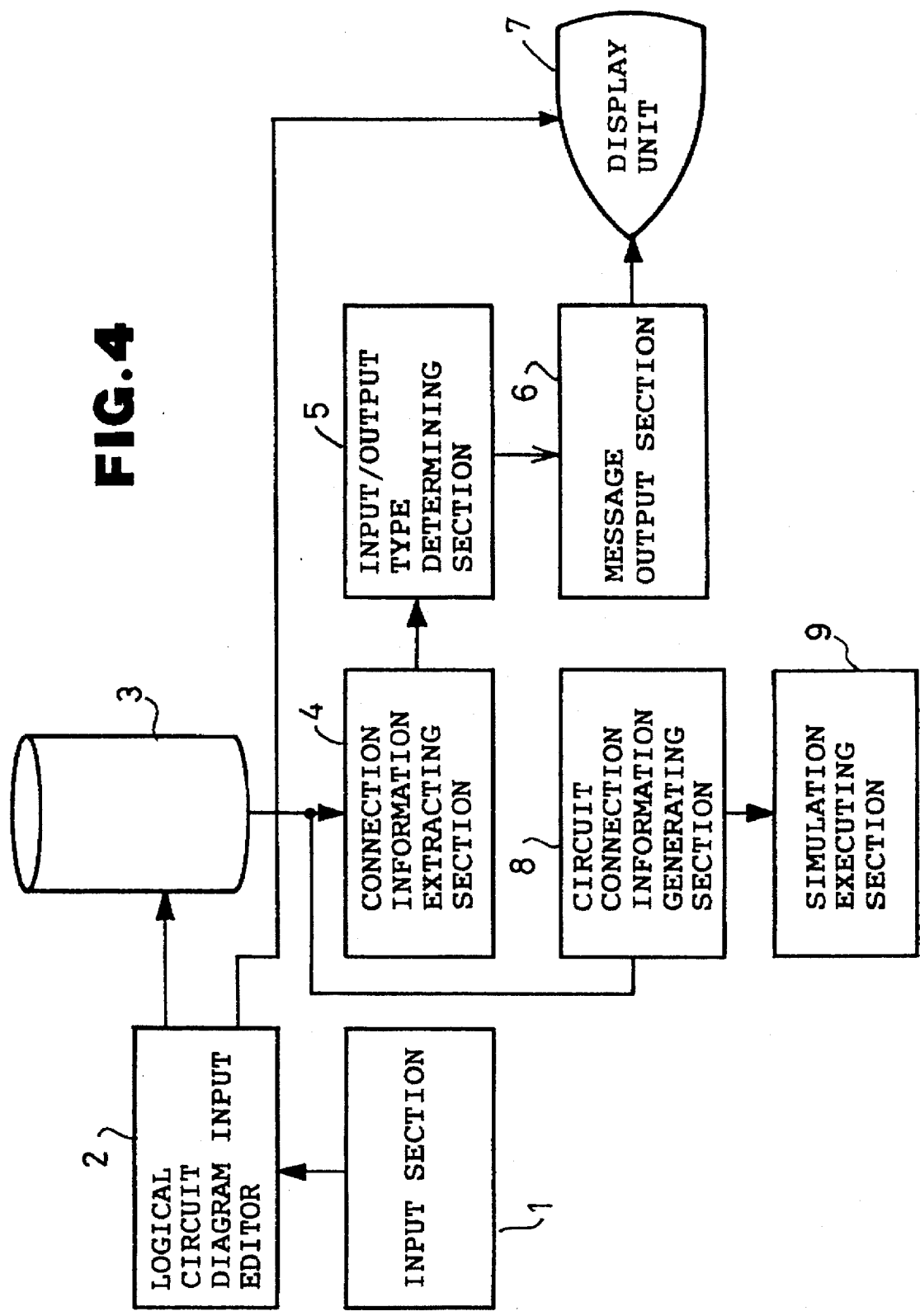
FIG. 4 is a block diagram showing the construction of a switch level simulation system according to a first embodiment of the present invention.

FIG. 4 is a block diagram showing the construction of a switch level simulation system according to a first embodiment of the present invention. Referring to the same Figure, reference numeral 1 designates an input section for a circuit designer to enter data, for example, a keyboard, a mouse or a scanner. Numeral 2 designates a logical circuit diagram input editor for producing a logical circuit diagram, numeral 3 designates a memory unit for storing a produced logical circuit diagram, numeral 4 designates a connection information extracting section for determining the input/output type of a switching device in a logical circuit diagram and the type of a device connected thereto, numeral 5 designates an input/output type determining section for determining whether the direction of a uni-directional switching device is valid, numeral 6 designates a message output section for producing an alarm message according to the determination of the input/output type determining section 5, numeral 7 designates a display unit for displaying an alarm message, numeral 8 designates a circuit connection information generating section, and numeral 9 designates a simulation executing section for executing simulation of a circuit on switch level. Meanwhile, this system can be realized in a computer system such as a work station.

Figure 5:
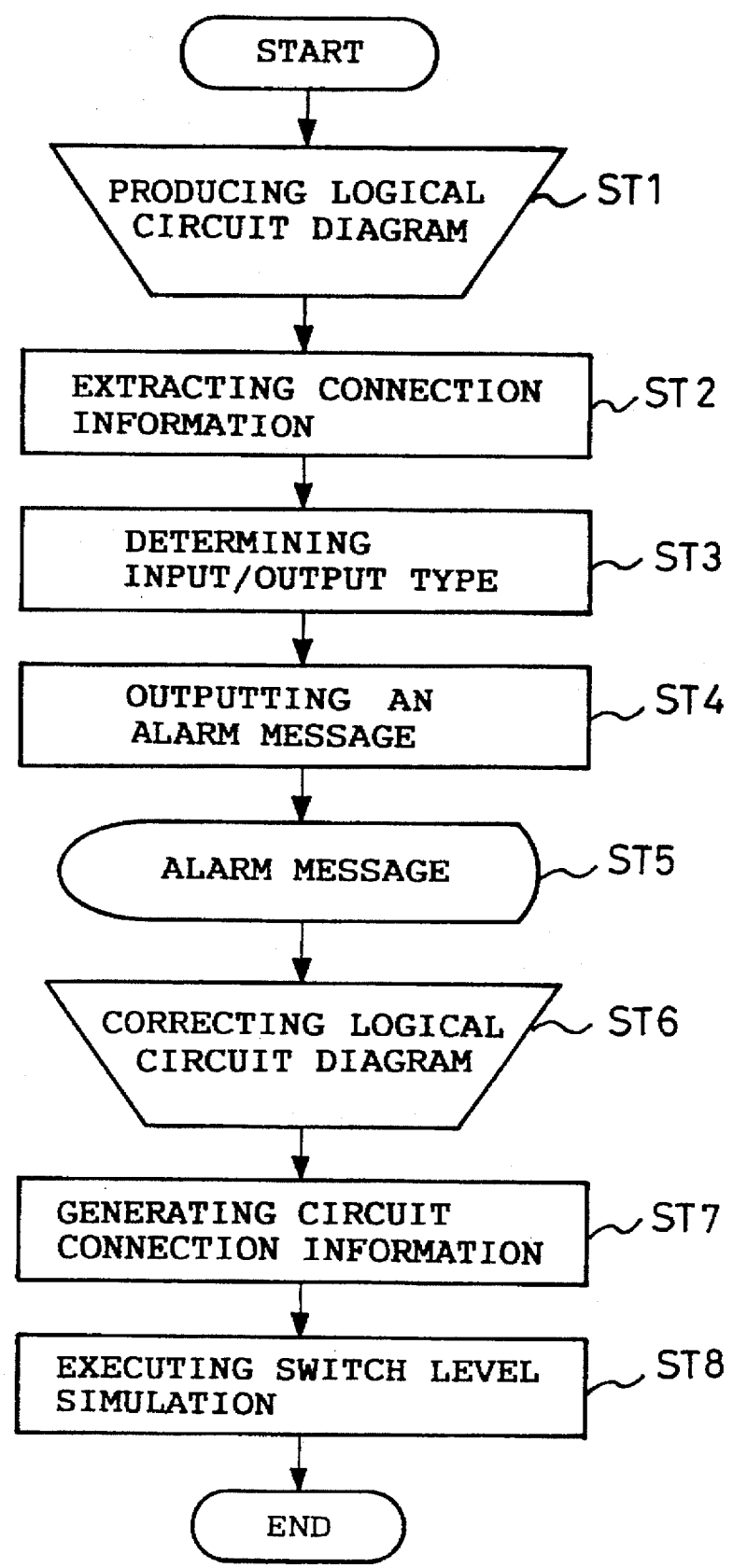
FIG. 5 is a flow chart showing the operation of the system shown in FIG. 4.

Then, the operation thereof will be described with reference to a flow chart shown in FIG. 5. First, a circuit designer makes a logical circuit diagram by using the logical circuit diagram input editor 2 (step 1). That is, he enters necessary data into the input section 1 while he refers to the content displayed in the display unit 7 of the logical circuit diagram input editor 2. The logical circuit diagram input editor 2 generates a logical circuit diagram according to entered data. Here, if the circuit designer determines that the switching device is bidirectional, he allocates a bidirectional switching symbol indicating a bidirectional switching device to the switching device. If he determines that the switching device is uni-directional, he allocates a uni-directional switching symbol indicating a uni-directional switching device to the switching device. Symbols such as a logical gate or the like may exist in a logical circuit diagram produced at this stage.

The logical circuit diagram input editor 2 attaches the following information indicating input/output type to the terminal of a switching device and a logical gate. If the logical circuit diagram input editor 2 contains no such function, the circuit designer attaches such information thereto by himself.

Attaching information "input" to a gate terminal and a source terminal of a uni-directional switching device.

Attaching information "input" to a gate terminal of a bidirectional switching device.

Attaching information "input" to an input terminal of a logical gate.

Attaching information "output" to a drain terminal of a uni-directional switching device.

Attaching information "output" to an output terminal of a logical gate.

Attaching information "inout" indicating a bidirectional terminal to a source terminal and a drain terminal of a bidirectional switching device.

Attaching information "output" to a ground terminal and a power supply terminal.

The terminal to which information "input" is attached is referred to as "input" terminal, the terminal to which information "output" is attached is referred to as "output" terminal, and the terminal to which information "inout" is attached is referred to as "inout" terminal.

Data (logical circuit diagram data) corresponding to a logical circuit diagram produced in the aforementioned manner is stored in the memory unit 3. The connection information extracting section 4 extracts each uni-directional switching device from the logical circuit diagram data. Further, The connection information extracting section 4 extracts the input/output type of the terminal of other device connected to the source terminal of each uni-directional switching device and that of the terminal of other device connected to the drain terminal thereof (step ST2). The input/output type mentioned here refers to "input", "output" or "inout". The other devices of which the input/output type is to be extracted include all the uni-directional switching device, the bidirectional switching device and the logical gate.

Figure 6:
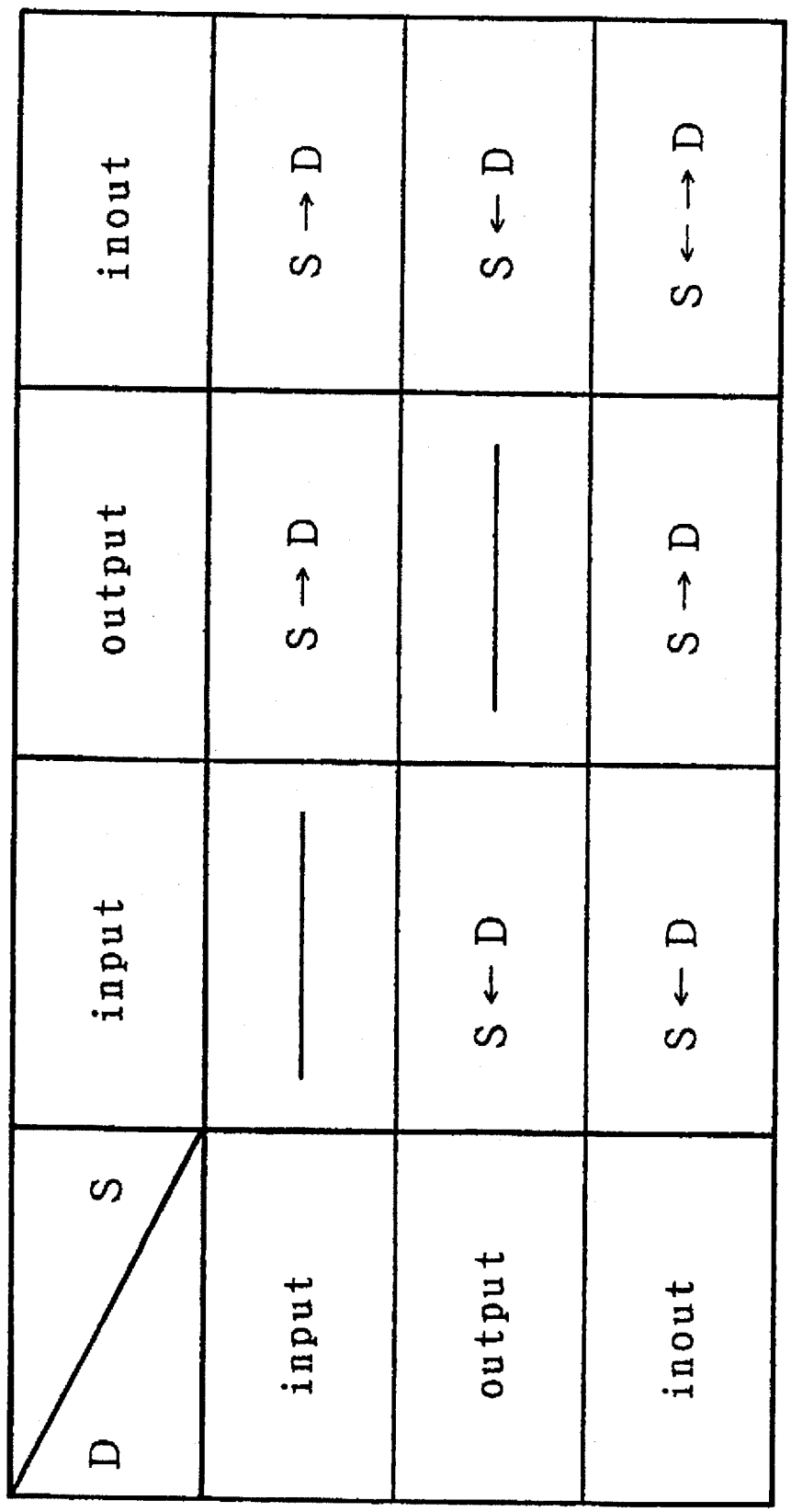
FIG. 6 is an explanatory diagram showing rules to be applied by the input/output type determining section.

Next, the input/output type determining section 5 determines the valid direction of each uni-directional switching device according to rules shown in FIG. 6 on the basis of respective data extracted by the connection information extracting section 4. Namely, the input/output type determining section 5 determines the direction of each uni-directional switching device according to the input/output type of the other device connected to the source terminal of the uni-directional switching device and the input/output type of the other device connected to the drain terminal thereof. In FIG. 6, the first row indicates the input/output type of the other device connected to the source terminal. The first column indicates the input/output type of the other device connected to the drain terminal. The arrows of the other grids indicate the flow direction of a signal.

For example, if the input/output type of the terminal of the other device connected to the source terminal is "output" and the input/output type of the terminal of the other device connected to the drain terminal is "input", the flow direction of a signal in a uni-directional switching device is from the source to the drain. If the input/output type of the terminal of the other device connected to the source terminal is "inout" and the input/output type of the terminal of the other device connected to the drain terminal thereof is "inout", this same Figure indicates that there is a possibility that signals may flow bidirectionally through the uni-directional switching device.

In the case when the rules shown in FIG. 6 is applied, if both the "input" terminal and the "output" terminal are connected to a uni-directional switching device, it is assumed that the "inout" terminal is connected. Meantime, in FIG. 3, "S" means the source terminal of a uni-directional switching device and "D" means the drain terminal of a uni-directional switching device. However, "S" and "D" are meaningless at this stage and only convenient designations for discriminating the two terminals of the uni-directional switching device.

The input/output type determining section 5 determines whether the direction of a uni-directional switching device in logical circuit diagram data is valid (step ST3). Namely, if the direction of a uni-directional switching device decided by the input/output type determining section 5 is S←D, it can be determined that the direction of the uni-directional switching device in the logical circuit diagram data is not valid. In this case, a relating message is transmitted to the message output section 6. The message output section 6 generates an alarm message indicating that the direction of that switching device is inverse and outputs it to the display unit 7. If the direction is S←→D, it can be determined that the corresponding uni-directional switching device in the logical circuit data should have been a bidirectional switching device in fact. In this case, a corresponding message is transmitted to the message output section 6. The message output section 6 produces an alarm message indicating that the a bidirectional switching device should be used instead of the uni-directional switching device, and outputs it to the display unit (step ST4).

Figure 1:
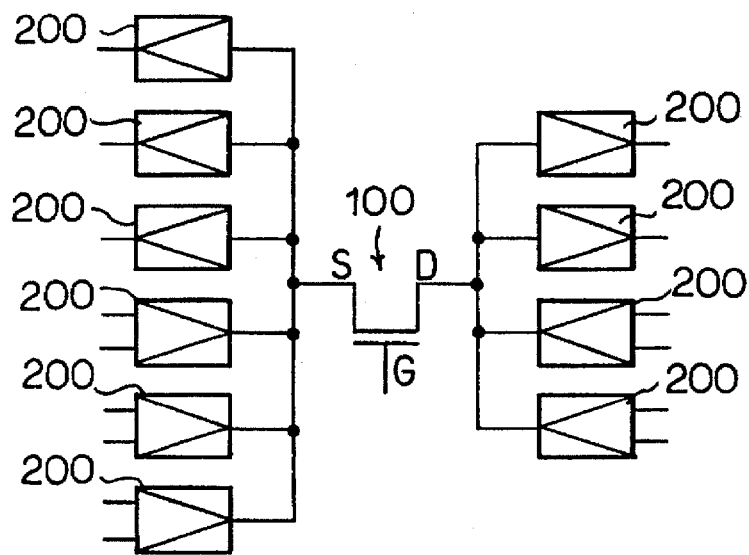
FIG. 1 is a circuit diagram showing the circuit of an object from which an equivalent circuit of a MOS device is produced in conventional simulation system.
Figure 2:
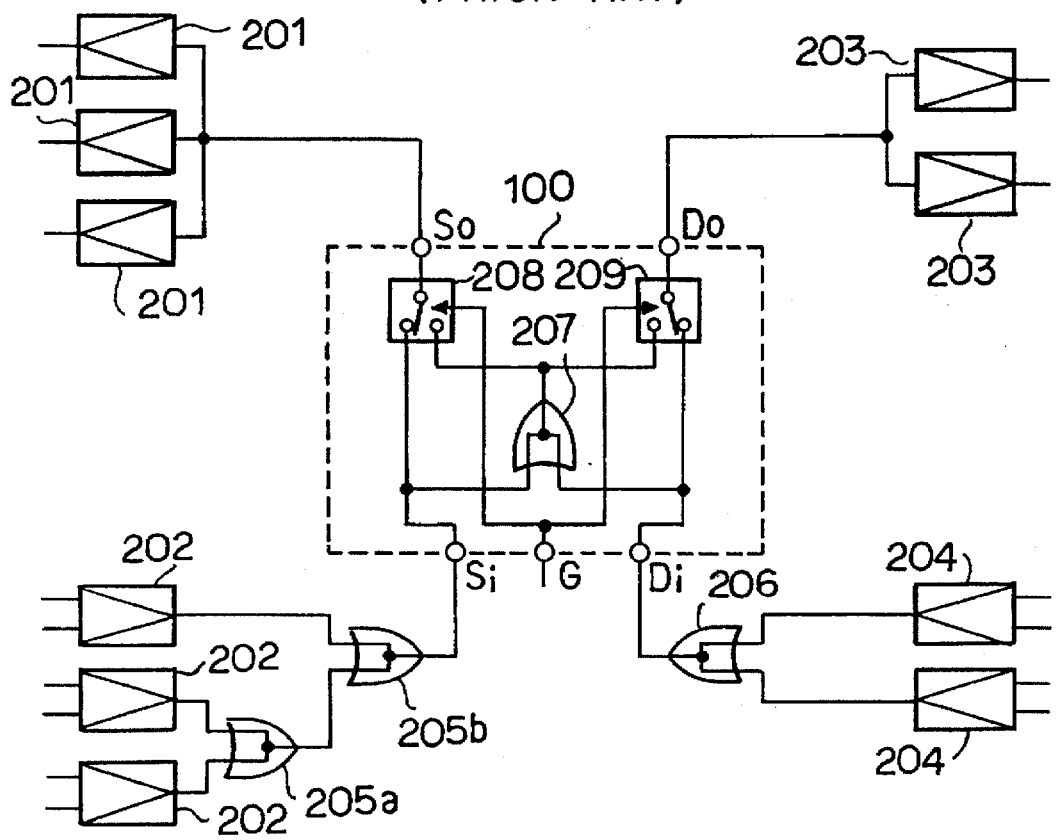
FIG. 2 is a circuit diagram showing the equivalent circuit of a MOS device in conventional simulation system.
Figure 3:
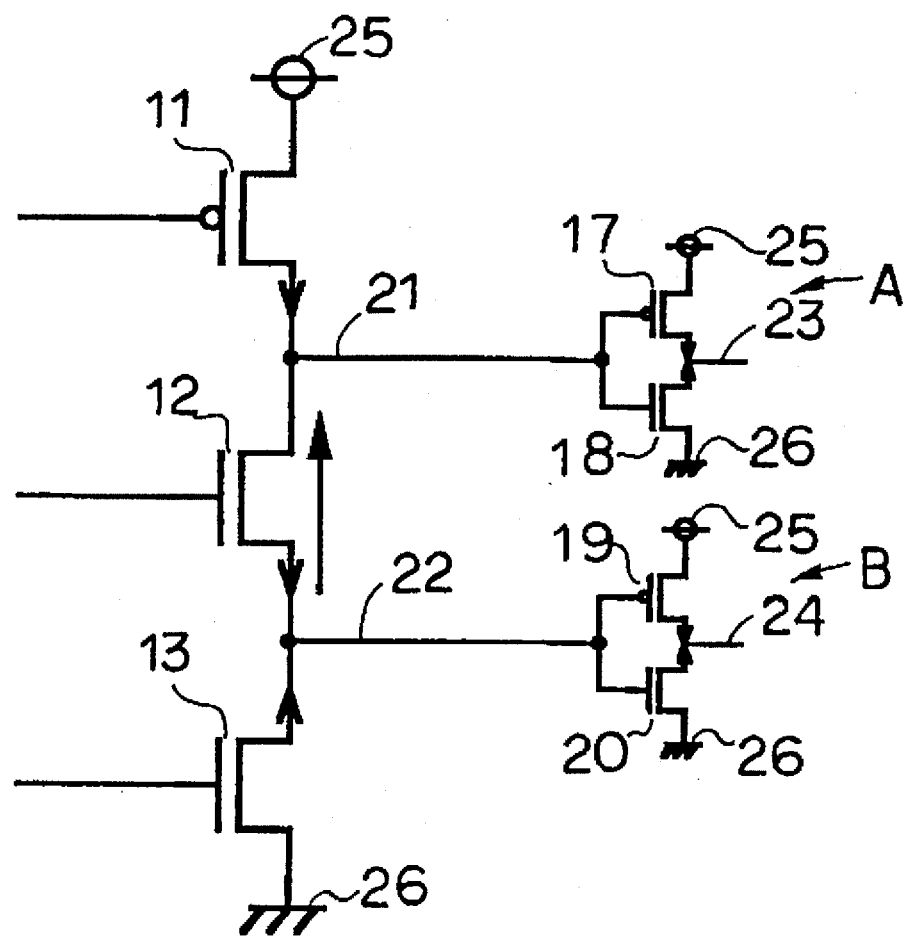
FIG. 3 is a circuit diagram showing an example of a circuit subject to simulation.

Here, the circuit shown in FIG. 3 is taken as an example. The drain terminal of the PMOS transistor 11 has information "output". Information "input" is attached to the gate terminal of the PMOS transistor 17 and the gate terminal of the NMOS transistor 18 (if a symbol indicating MOS inverter is represented instead of the symbol corresponding to the PMOS transistor 17 and the NMOS transistor 18, information "input" is attached to the input terminal of that inverter). Thus, as a result, the source terminal of the NMOS transistor 12 is connected to the "inout" terminal.

Information "output" is attached to the drain terminal of the NMOS transistor 13. Information "input" is attached to the gate terminal of the PMOS transistor 19 and the gate terminal of the NMOS transistor 20. Thus, as a result the drain terminal of the NMOS transistor 12 is connected to the "inout" terminal. Because the source terminal and the drain terminal of the NMOS transistor 12 are connected to the "inout" terminal, the directivity of the NMOS transistor 12 is validly S←→D according to the rule shown in FIG. 6. Therefore, the message output section 6 generates an alarm message indicating that a bidirectional switching device should be used for the NMOS transistor 12.

The display unit 7 displays an alarm message from the message output section 6 (step ST5). Or the message output section 6 outputs the alarm message to a printer (not shown). The printer outputs the alarm message as an error list.

A circuit designer corrects the switching device by inverting the direction of an appropriate uni-directional switching device in logical circuit diagram data or replacing it with a bidirectional switching device according to the output alarm message (step ST6).

The circuit connection information generating section 8 generates circuit connection information to be entered to the switch level simulation executing section 9 by using the corrected logical circuit diagram data (step ST7). The switch level simulation executing section 9 receives circuit connection information and executes logical simulation on switch level or timing simulation on switch level according to the event driven method (step ST8).

Although the operations of the circuit connection information generating section 8 and the simulation executing section 9 are the same as that of the typical simulation system, the validity of logical circuit diagram data to be entered to the circuit connection information generating section 8 is higher in this case. That is, because the logical circuit diagram data has undergone correction based on determining of the input/output type determining section 5, the direction of each switching device is more accurate than the typical simulation system.

Embodiment 2

Figure 7:
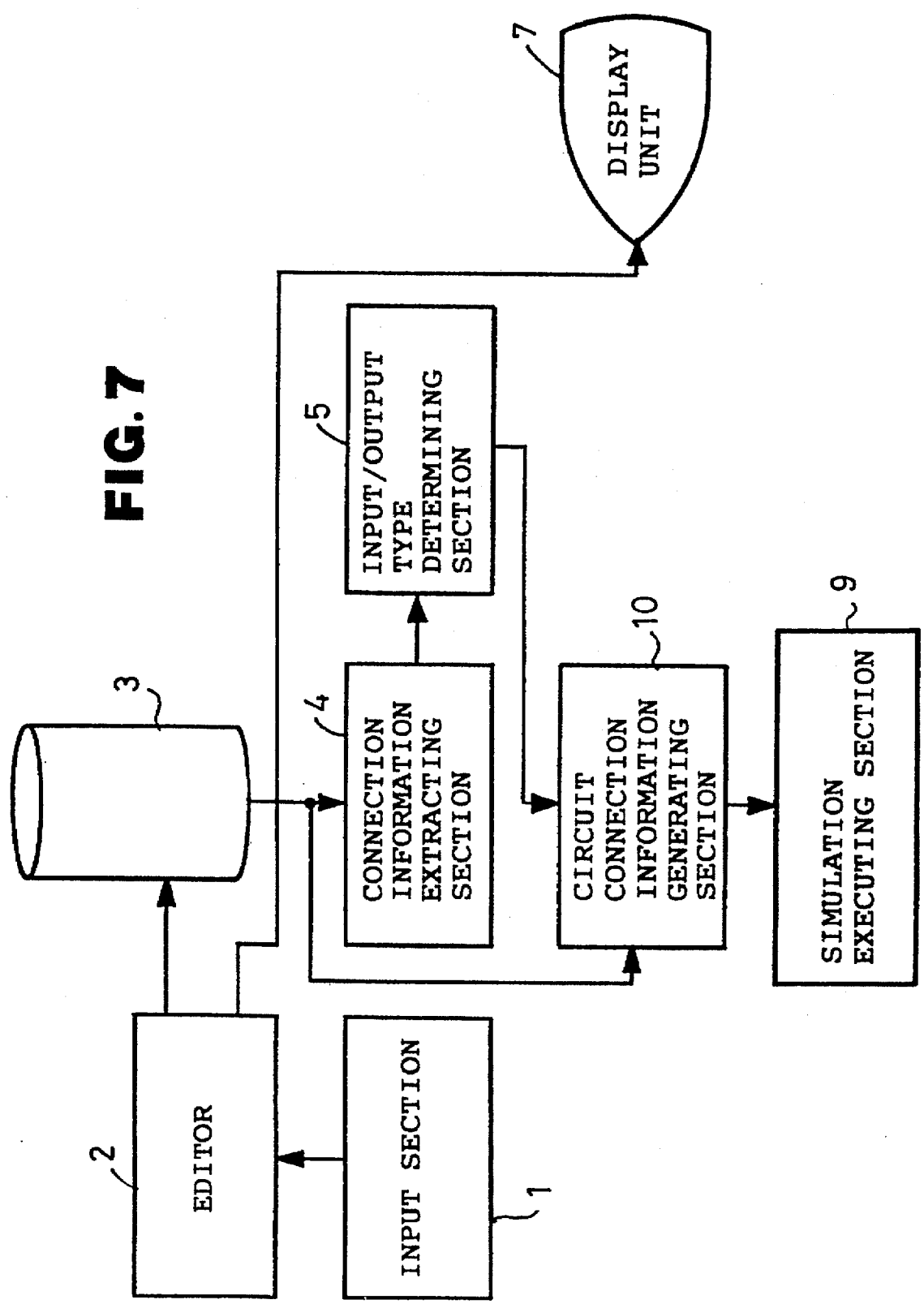
FIG. 7 is a block diagram showing the construction of a switch level simulation system according to a second embodiment of the present invention.

FIG. 7 is a block diagram showing the construction of a switch level simulation system according to a second embodiment of the present invention. Referring to the same Figure, reference numeral 1 designates an input section for a circuit designer to enter data, numeral 2 designates a logical circuit diagram input editor for producing a logical circuit diagram, numeral 3 designates a memory unit for storing a produced logical circuit diagram, numeral 4 designates a connection information extracting section for determining the input/output type of a switching device in the logical circuit diagram and a device connected thereto, numeral 5 designates an input/output type determining section for determining the validity of the direction of a uni-directional switching device, numeral 7 designates a display unit to be used for production of a logical circuit diagram, and numeral 10 designates a circuit connection information generating section having correction function, the circuit connection information generating section correcting logical circuit data according to the result of determination of the input/output type determining section 5 in order to generate circuit connection information.

Figure 8:
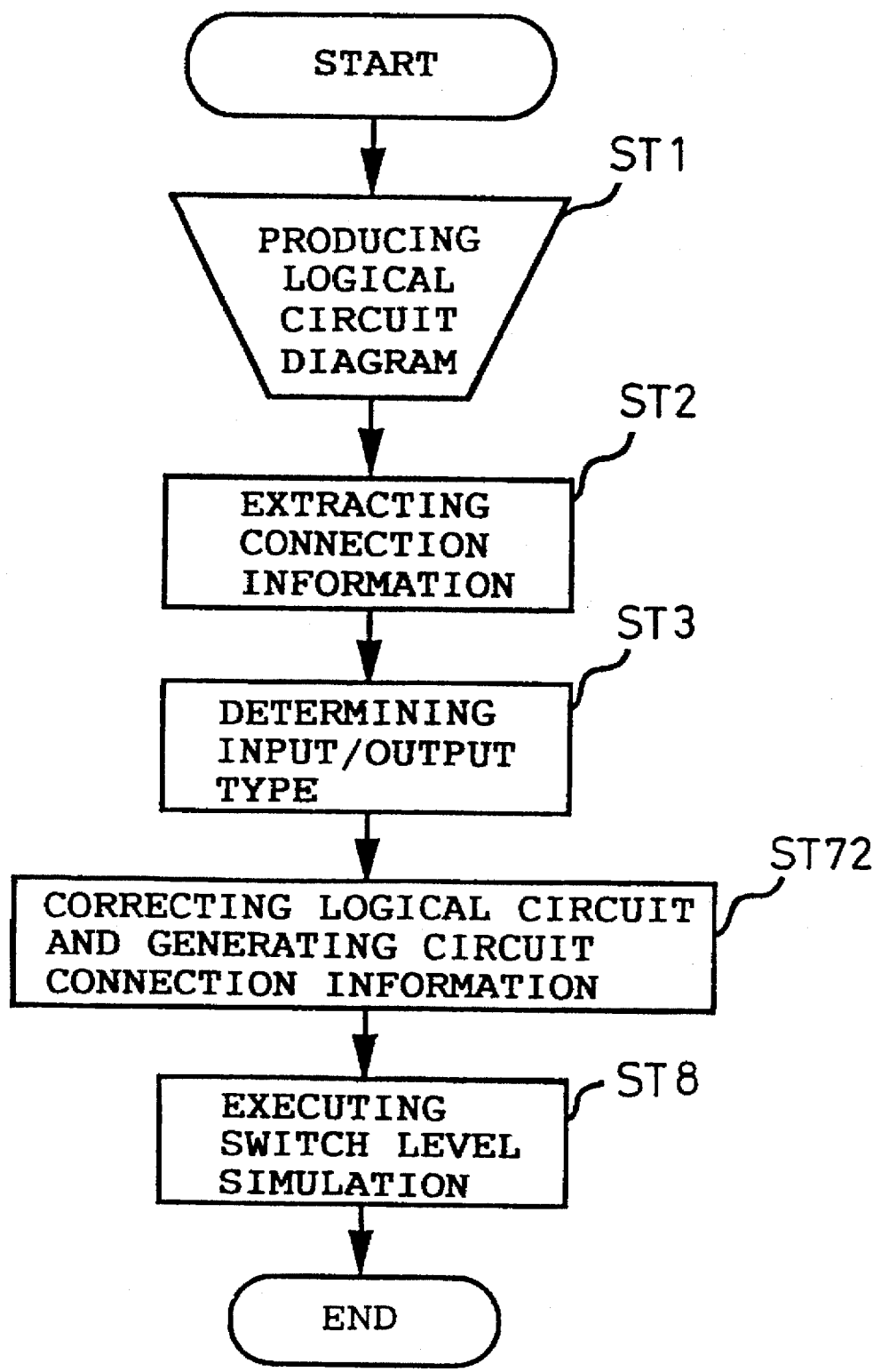
FIG. 8 is a flow chart showing the operation of the system shown in FIG. 7.

Next, the operation thereof will be described with reference to a flow chart shown in FIG. 8. First, a circuit designer produces a logical circuit diagram by using the logical circuit diagram input editor 2 as in the first embodiment (step ST1). Next, the connection information extracting section 4 extracts respective uni-directional switching devices from the logical circuit diagram data as in the first embodiment. Further, the connection information extracting section 4 extracts the input/output type of the terminal of the other device connected to the source terminal of each uni-directional switching device and the input/output type of the terminal of the other device connected to the drain terminal (step ST2). The input/output type determining section 5 determines a valid direction of each uni-directional switching device according to rules shown in FIG. 6 on the basis of each data extracted by the connection information extracting section 4 (step ST3).

In this case, the circuit connection information generating section 10 introduces the result of the determination of the input/output type determining section 5. Then, the circuit connection information generating section 10 inverts the direction of the uni-directional switching device which is pointed out about its reverse direction by the input/output type determining section 5. Further, the circuit connection information generating section 10 removes the uni-directional switching devices which are pointed out about their necessity of using a bidirectional switching device and allocates bidirectional switching devices at those positions where the uni-directional switching devices have been removed. The circuit connection information generating section 10 generates circuit connection information to be entered to a switch level simulation executing section 9 by using such corrected logical circuit diagram data (step ST72). The simulation executing section 9 receives circuit connection information and then executes logical simulation on switch level or timing simulation on switch level (step ST8).

As described above, the switch level simulation system according to the present embodiment automatically validates the direction of each switching device set by a circuit designer and generates more accurate circuit connection information, thereby improving the effectiveness of logical simulation on switch level or timing simulation on switch level.

Embodiment 3

Figure 9:
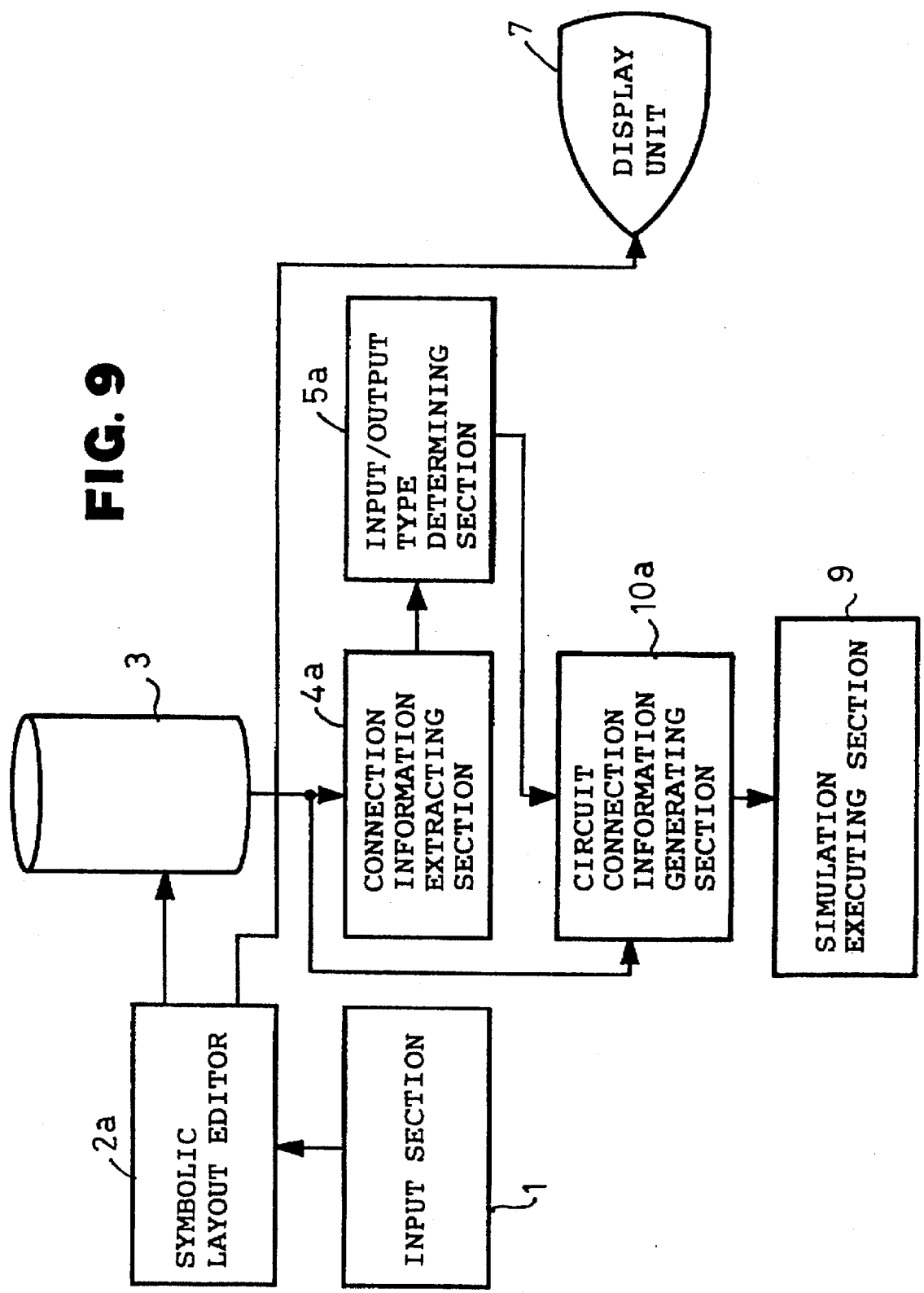
FIG. 9 is a block diagram showing the construction of a switch level simulation system according to a third embodiment of the present invention.

Although logical circuit data is corrected in the aforementioned respective embodiments, it is permissible to obtain circuit information from layout data and then correct that information. FIG. 9 is a block diagram showing the construction of a switch level simulation system according to a third embodiment of the present invention for obtaining circuit connection information from layout data. Referring to the same Figure, reference numeral 1 designates an input section for a circuit designer to enter data, numeral 2a designates a symbolic layout editor for generating layout data according to a symbolic diagram, numeral 4a designates a connection information extracting section for extracting a transistor device (input/output type not determined device) of which the input/output type has not been yet determined connected to a device of which the input/output type has been determined, the input/output type of the terminal of the other device to be connected to the source terminal of an input/output type not determined device, and the input/output type of the terminal of the other device to be connected to the drain terminal of an input/output type not determined device, based on layout data, numeral 5a designates an input/output type determining section for determining the direction of an input/output type not determined device, numeral 7 designates a display unit to be used during the operation of the symbolic layout editor 2a, and numeral 10a designates a circuit connection information generating section for generating circuit connection information by allocating a bidirectional switch model or a uni-directional switch model.

Figure 10:
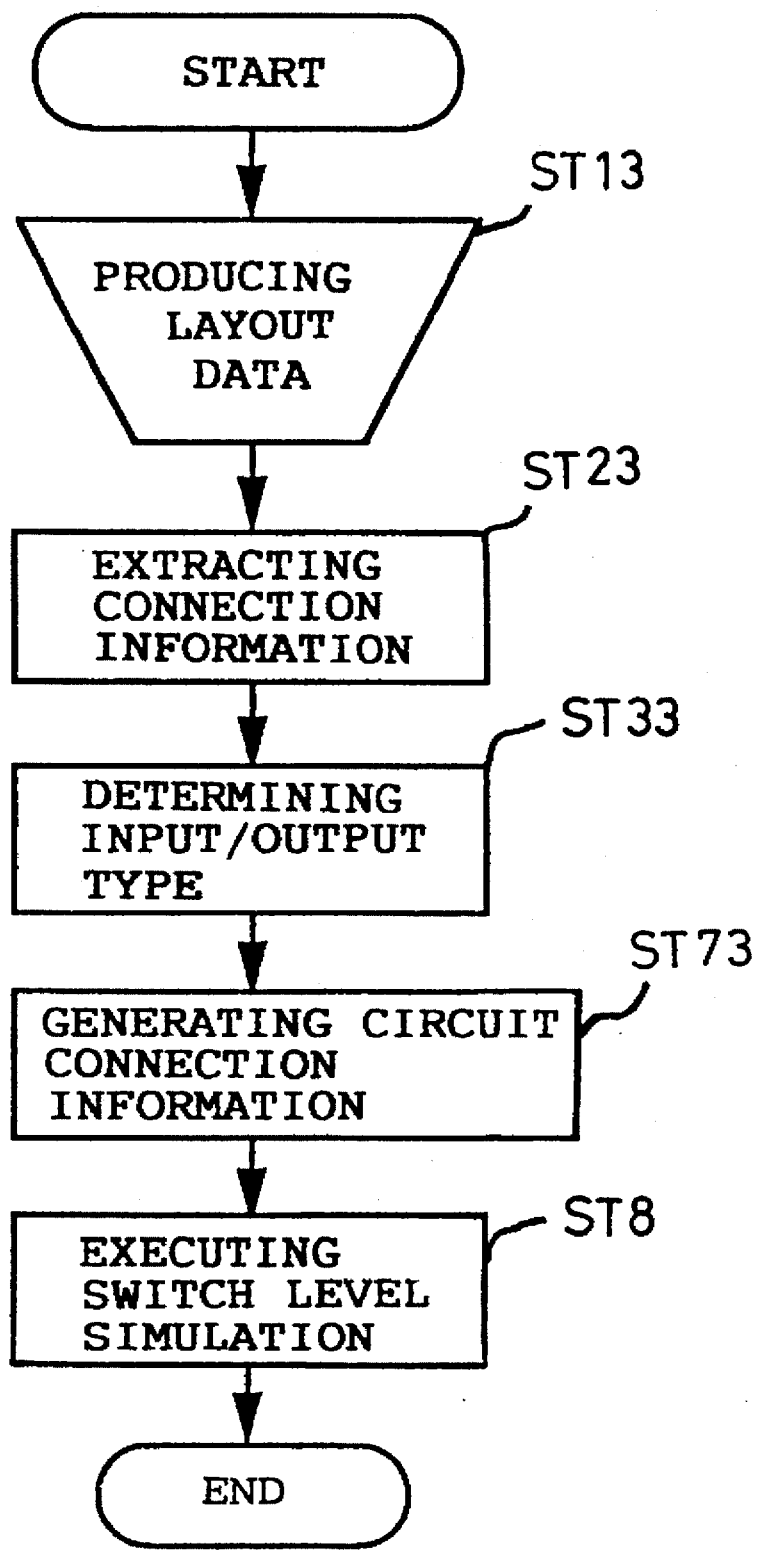
FIG. 10 is a flow chart showing the operation of the system shown in FIG. 9.

Next, the operation thereof will be described with reference to a flow chart shown in FIG. 10. A circuit designer produces a symbolic diagram in which logical gates and the like are represented with symbols by using the symbolic layout editor 2a. The symbolic layout editor 2a produces layout data indicating the layout of a transistor cell according to the symbolic diagram (step ST13). Here, the transistor in layout data is not discriminated with respect to whether it is bidirectional or uni-directional.

The symbolic layout editor 2a attaches the following information indicating the input/output type to the terminal, the power supply terminal and the ground terminal of a transistor. If the symbolic layout editor 2a has no such function, a circuit designer attaches relating information by himself.

Attaching information "input" to a gate terminal of a transistor.

Attaching information "inout" to a source terminal and a drain terminal of a transistor.

Attaching information "output" to a power supply terminal and a ground terminal.

The connection information extracting section 4a extracts devices of which the direction have been determined, i.e. input/output type determined devices, based on layout data. The input/output type determined device means a transistor having a terminal to which information "input" is attached or a terminal to which information "output" is attached. Additionally, the connection information extracting section 4a extracts input/output type not devices. The input/output type not determined device means a transistor to be connected to a device an input/output type determined device. Further, the input/output type extracting section 4a extracts the input/output type of the terminal of the other device connected to the source terminal of an input/output type not determined device and extracts the input/output type of the terminal of the other device connected to the drain terminal of an input/output type not determined device (step ST23).

The input/output type determining section 5a applies rules shown in FIG. 6 about each input/output type not determined device in order to determine the direction of the device. That is, the input/output type determining section 5a determines the direction (S→D, S←D or S←→D) of each input/output type not determined device, according to the input/output type of the terminal of the other device connected to each input/output type not determined device (step ST33). Then, the input/output type determining section 5a attaches information "input", "output" or "inout" to the terminal of the device of which the direction has been determined. In the manner described above, information concerning the input/output type is attached to each input/output type not determined device.

The circuit connection information generating section 10a introduces the result of determining of the input/output type determining section 5a. Then, it allocates a uni-directional switch model corresponding to the direction of the device of which the input/output type has been determined. Additionally, it allocates a uni-directional switch model or a bidirectional switch model fitting to the direction of the terminal of the device of which the input/output type has been determined, in the circuit. That is, for a device of which the direction is determined to be S→D or S←D, a uni-directional switch model corresponding to that direction is allocated. For a device of which the direction is determined to be S←→D, a bidirectional switch model is allocated. Then, the circuit connection information generating section 10a generates circuit connection information, using each model the direction of which has been determined (step ST73). The switch level simulation executing section 9 receives circuit connection information and executes logical simulation on switch level or timing simulation on switch level (step ST8).

As described above, the present embodiment makes it possible to execute logical simulation on switch level or timing simulation on switch level by entering layout data comprising data about a transistor which is not discriminated between bidirectional and uni-directional.

What is claimed is:

1. A switch level simulation system for executing simulation of a logic circuit on switch level, comprising:
    an input means for inputting circuit information representing said logic circuit;
    a connection information extracting section for extracting the connection state of each device in said logic circuit indicated by said circuit information and adding information indicating output or input to each terminal of each device;
    an input/output type determining section for determining whether a switching device in said logic circuit is bidirectional and the flow direction of a signal in an uni-directional switching device on the basis of information indicating output or input of each terminal of each device added by said connection information extracting section;
    a circuit connection information generating section for generating circuit connection information using the result of determining about switching devices by said input/output type determining section; and
    a simulation execution section for executing simulation of a circuit on switch level according to said circuit connection information.

2. A switch level simulation system according to claim 1, wherein the input/output type determining section determines that a uni-directional switching device may be actually bidirectional if the terminal of the other device connected to one terminal of the uni-directional switching device and the terminal of the other device connected to another terminal of said uni-directional switching device are both bidirectional.

3. A switch level simulation system according to claim 1, wherein the input means includes a logical circuit diagram data producing section for entering logical circuit diagram data as said circuit information.

4. A switch level simulation system according to claim 3, wherein the input/output type determining section determines that a uni-directional switching device may be actually bidirectional if the terminal of the other device connected to one terminal of the uni-directional switching device and the terminal of the other device connected to another terminal of said uni-directional switching device are both bidirectional.

5. A switch level simulation system according to claim 3 wherein,
    the input/output type determining section includes means for determining whether the flow direction of a signal in a switching device is different from the flow direction of a signal in logical circuit diagram data; and said system further comprises:
    a message output section for outputting an alarm message when said means for determining determines that the flow direction of a signal in a switching device is different.

6. A switch level simulation system according to claim 5, wherein the input/output type determining section determines that a uni-directional switching device may be actually bidirectional if the terminal of the other device connected to one terminal of the uni-directional switching device and the terminal of the other device connected to another terminal of said uni-directional switching device are both bidirectional.

7. A switch level simulation system according to claim 3, wherein the circuit connection information generating section corrects circuit information according to the result of determining of the input/output type determining section and generates circuit connection information when the flow direction of a signal in a switching device determined by the input/output type determining section is different from the flow direction of a signal in logical circuit diagram.

8. A switch level simulation system according to claim 7, wherein the input/output type determining section determines that a uni-directional switching device may be actually bidirectional if the terminal of the other device connected to one terminal of the uni-directional switching device and the terminal of the other device connected to another terminal of said uni-directional switching device are both bidirectional.

9. A switch level simulation system according to claim 1, wherein the input means includes a layout data producing section for entering layout data as circuit information.

10. A switch level simulation system according to claim 9, wherein the input/output type determining section determines that a uni-directional switching device may be actually bidirectional if the terminal of the other device connected to one terminal of the uni-directional switching device and the terminal of the other device connected to another terminal of said uni-directional switching device are both bidirectional.

11. A switch level simulation method comprising:
    a connection information producing step for extracting the connection state of each device in a logic circuit, indicated by circuit information;

an input/output type determining step for determining whether or not a switching device in said logic circuit is bidirectional and the flow direction of a signal in a uni-directional switching device on the basis of information indicating output or input of each terminal of each device, wherein the direction of each switching device is determined according to the input/output type of another device connected to the source terminal of the switching device and the input/output type of the other device connected to the drain terminal of the switching device;

a circuit connection information generating step for generating circuit connection information using the result of said input/output type determining step; and a simulation executing step for executing simulation of a circuit on switch level according to said circuit connection information.

12. A switch level simulation method according to claim 11, wherein the input/output type determining step includes a step for determining that a uni-directional switching device may be actually bidirectional if the terminal of the other device connected to one terminal of the uni-directional switching device and the terminal of the other device connected to another terminal of said uni-directional switching device are both bidirectional.

13. A switch level simulation method according to claim 11 further comprising a message output step for outputting an alarm message when the flow direction of a signal in a switching device, determined by the input/output type determining step is different from the flow direction of a signal in circuit information.

14. A switch level simulation method according to claim 13, wherein the input/output type determining step includes a step for determining that a uni-directional switching device may be actually bidirectional if the terminal of the other device connected to one terminal of the uni-directional switching device and the terminal of the other device connected to another terminal of said uni-directional switching device are both bidirectional.

15. A switch level simulation method according to claim 11 further comprising a circuit information correction step for correcting circuit information according to the result of determining of the input/output type determining section if the flow direction of a signal in a switching device determined by the input/output type determining step is different from the flow direction of a signal in a logical circuit diagram data.

16. A switch level simulation method according to claim 15, wherein the input/output type determining step includes a step for determining that a uni-directional switching device may be actually bidirectional if the terminal of the other device connected to one terminal of the uni-directional switching device and the terminal of the other device connected to another terminal of said uni-directional switching device are both bidirectional.

* * * * *